(12) United States Patent
Ruffieux

(10) Patent No.: US 8,615,202 B2
(45) Date of Patent: Dec. 24, 2013

(54) FREQUENCY SYNTHESIZER

(75) Inventor: David Ruffieux, Lugnorre (CH)

(73) Assignee: CSEM Centre Suisse d'Electronique et de Microtechnique SA—Recherche et Development, Neuchatel (CH)

( * ) Notice: Subject to any disclaimer, the term of this patent is extended or adjusted under 35 U.S.C. 154(b) by 197 days.

(21) Appl. No.: 13/258,099

(22) PCT Filed: Mar. 24, 2010

(86) PCT No.: PCT/EP2010/053817
§ 371 (c)(1),
(2), (4) Date: Sep. 21, 2011

(87) PCT Pub. No.: WO2010/108943
PCT Pub. Date: Sep. 30, 2010

(65) Prior Publication Data
US 2012/0015610 A1    Jan. 19, 2012

(30) Foreign Application Priority Data
Mar. 24, 2009  (EP) .................................... 09156065

(51) Int. Cl.
*H04B 1/40*    (2006.01)
*H03B 19/12*   (2006.01)
*H03J 7/04*    (2006.01)

(52) U.S. Cl.
CPC .. *H04B 1/405* (2013.01); *H03J 7/04* (2013.01)
USPC ............. 455/76; 455/255; 455/258; 455/260; 331/50; 331/51; 331/53; 331/56

(58) Field of Classification Search
USPC .......... 455/76, 255, 260, 258; 331/46, 47, 50, 331/51, 53, 56
See application file for complete search history.

(56) References Cited

U.S. PATENT DOCUMENTS 5,038,404 A    8/1991   Marz
5,055,800 A *  10/1991  Black et al. .................. 331/1 A (Continued)

FOREIGN PATENT DOCUMENTS

FR    2 864 733       7/2005
WO    2008/036389    3/2008

OTHER PUBLICATIONS

International Search Report dated Jun. 25, 2010, corresponding to PCT/EP2010/053817.

(Continued)

*Primary Examiner* — Duc M Nguyen
(74) *Attorney, Agent, or Firm* — Young & Thompson

(57) ABSTRACT

A frequency synthesizer includes: a first oscillator (1) controlled by a first control device, the first oscillator having a high quality factor that is greater than 300 and produces a first clock signal (2) RF having a fixed frequency, the first control device (30) controlling the frequency of the first controlled oscillator (1) on the basis of a first reference frequency; a second oscillator (3) controlled by a second control device and producing a second clock signal (4); the second control device (31) controlling the frequency of the second controlled oscillator (3) on the basis of a second reference frequency; and an integer frequency divider (5) dividing the frequency of the second clock signal (4) by a variable integer factor $N_1$ and producing a third clock signal (6), the frequency of which is continuously variable by modifying the factor $N_1$ and the control of the second oscillator.

20 Claims, 4 Drawing Sheets

(56) References Cited

U.S. PATENT DOCUMENTS

| | | | |
|---|---|---|---|
| 5,398,007 A * | 3/1995 | Yamazaki et al. | 331/46 |
| 5,717,730 A * | 2/1998 | Prakash et al. | 375/376 |
| 6,566,921 B1 * | 5/2003 | Boerstler et al. | 327/156 |
| 7,324,788 B2 * | 1/2008 | Ramet et al. | 455/76 |
| 7,598,815 B2 * | 10/2009 | Chen et al. | 331/16 |
| 8,258,925 B2 * | 9/2012 | Lam et al. | 340/10.1 |
| 2004/0092234 A1 | 5/2004 | Pohjonen | |
| 2005/0189998 A1 | 9/2005 | Cathelin et al. | |
| 2006/0001494 A1 | 1/2006 | Garlepp et al. | |
| 2007/0008429 A1 * | 1/2007 | Cha et al. | 348/528 |
| 2008/0197891 A1 | 8/2008 | Park et al. | |

OTHER PUBLICATIONS

European Search Report dated Jul. 29, 2009, corresponding to Foreign Priority Application No. EP 09 15 6065.6.

* cited by examiner

FREQUENCY SYNTHESIZER

TECHNICAL FIELD

The present invention relates to the field of frequency synthesizers, and more particularly to frequency synthesizers intended for radiofrequency (RF) devices.

BACKGROUND OF THE INVENTION

Radiofrequency transmitting/receiving devices require RF clocks (generally of the GHz order) having a high spectral purity (i.e. whereof the component at the central frequency of the spectrum has an amplitude much higher than the other components of the spectrum). The frequency of these clocks must also be easily adjustable, so as to cover the targeted frequency band. Standards generally provide for the allocation of frequency bands, and these frequency bands can be divided into a plurality of consecutive channels. It is therefore necessary to be able to produce a clock whereof the frequency can cover each channel of the frequency band.

Generally, the frequency synthesizers intended to generate these RF clocks are based on the use of a reference clock, with a frequency much lower than the frequency of the RF clock to be obtained. A PLL (Phase-Locked Loop) is then used to multiply the frequency of the reference clock to reach the desired frequency. The use, in the PLL, of a fractional frequency divider makes it possible to obtain an RF clock whereof the frequency is a non-integer multiple of the frequency of the reference clock, thereby allowing a very subtle adjustment of the frequency of the RF clock. The RF clock may be obtained using an LC resonant circuit, and the capacity of which would be variable so as to increase the range of reachable frequencies. The spectral purity of the clock obtained with such a synthesizer can, however, prove insufficient, particularly if the inductance of the LC circuit is made on an integrated circuit, or can then require a very high consumption, which penalizes the autonomy of the system using this type of synthesizer.

Oscillators based on a high-frequency electromechanical resonant element such as a BAW (Bulk Acoustic Wave) make it possible to obtain a spectral purity that is greatly improved relative to the LC oscillator (in the vicinity of 30 dB gain at equal power). A variable capacitive element makes it possible to modify the frequency of the clock produced by such an oscillator, but the variation range of this frequency is not as expansive as that of an LC oscillator with a variable capacity, and generally does not make it possible to cover a wide enough frequency band. Thus, such oscillators are preferably used to generate clock signals at a fixed RF frequency, the aging and dependence of the frequency at the temperature being able to be offset by the use of a more stable reference, such as a quartz.

In order to improve the expanse of the frequency variation range of the clock produced by a BAW, it is possible to divide the frequency obtained by the BAW oscillator, through a fractional division, so as to obtain an IF (Intermediate Frequency) signal, the frequency of which can be varied by modifying the division factor. This IF clock is then mixed with the RF clock coming from the BAW oscillator in order to obtain a variable-frequency RF clock. This solution is not satisfactory, because the fractional division introduces significant phase noise on the IF clock. As a result, after mixing, the phase noise on the variable-frequency RF clock is of the same magnitude as or even greater than that which can be achieved with an LC oscillator. The advantage of the spectral purity of the BAW oscillator is thus lost.

The present invention proposes a frequency synthesizer making it possible to obtain a variable-frequency clock signal with high spectral purity while avoiding the aforementioned drawbacks.

BRIEF DESCRIPTION OF THE INVENTION

The present invention relates to a frequency synthesizer as described in the claims of the present application.

BRIEF DESCRIPTION OF THE DRAWINGS

Other features of the present invention will appear more clearly upon reading the following description, done in reference to the appended drawing, in which.

DETAILED DESCRIPTION OF THE INVENTION

Figure 1:
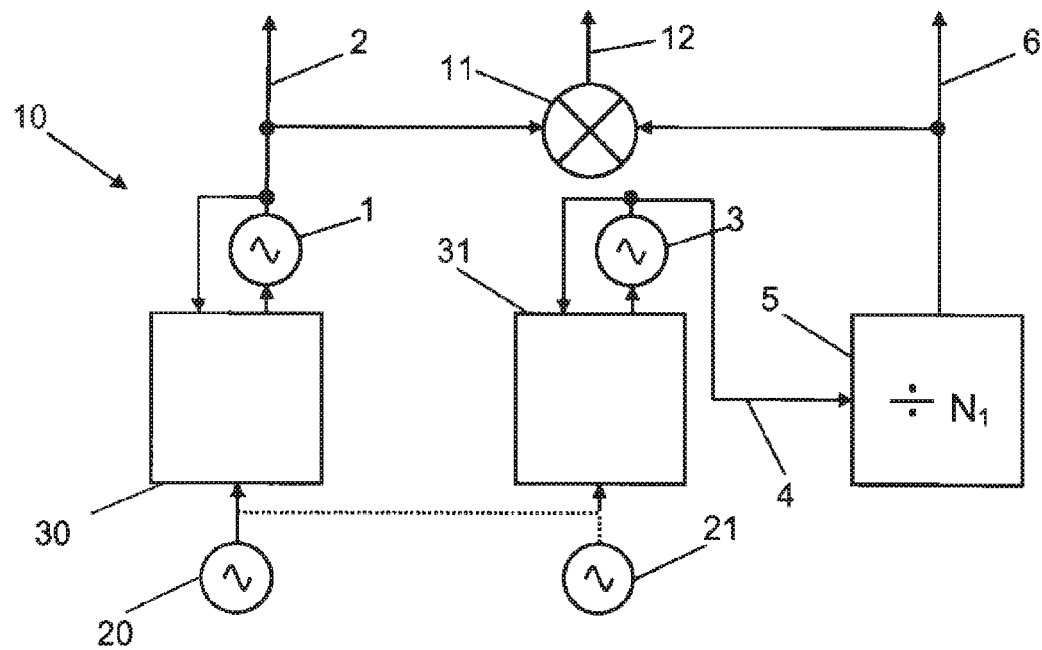
FIG. 1 shows a frequency synthesizer according to a first alternative of the present invention.

A first alternative of a frequency synthesizer is shown in FIG. 1, the frequency synthesizer 10 comprising:
  a first oscillator 1 controlled by a first control device, the first controlled oscillator having a high quality factor, typically greater than 300 and producing a first clock signal 2 RF having a fixed frequency,
  the first control device 30 controlling the frequency of the first controlled oscillator 1 on the basis of a first reference frequency,
  a second oscillator 3 controlled by a second control device, and producing a second clock signal 4,
  the second control device 31 controlling the frequency of the second controlled oscillator 3 on the basis of a second reference frequency, and
  an integer frequency divider 5, dividing the frequency of the second clock signal 4 by a variable integer factor N1 and producing a third clock signal 6, the frequency of which is continuously variable by modifying the factor N1 and the control of the second oscillator.

The spectral purity of an oscillator is related to the quality factor Q of the resonator used. The higher the factor Q, the greater the spectral purity of the clock signal produced by the oscillator. The quality factor Q is defined by the ratio between the energy stored in the resonator and that which is dissipated per cycle.

The assembly made up of the first controlled oscillator and the first control device 30 is traditionally a PLL, the input of which is a first reference frequency produced by a third fixed oscillator 20.

To obtain a quality factor greater than 300, the first controlled oscillator 1 is based on a high-frequency electromechanical resonant element such as a BAW (Bulk Acoustic Wave). An SAW (Surface Acoustic Wave) type oscillator is also suitable.

The assembly formed by the second controlled oscillator 3 and the second control device 31 is also traditionally a PLL, the input of which is a second reference frequency produced by a fourth fixed oscillator 21. According to one alternative, the second reference frequency can have the same signal as the first reference frequency, therefore also produced by the third fixed oscillator 20. The controlled oscillator 3 is traditionally a VCO (Voltage-Controlled Oscillator), of the LC type, the control of which is ensured by modifying the capacity of the LC circuit.

The use of a frequency divider 5 having an integer division factor N1 makes it possible to significantly reduce the phase noise of the third clock signal 6, the phase noise being reduced by a ratio that is the square of the division factor.

For example, a division with a factor of N1=30 makes it possible to decrease the phase noise by 30 dB. Furthermore, with a variable factor N1, the frequency adjustment range of the third clock signal 6 is extended despite a limited variation range of the second clock signal 4.

The frequency of the oscillator 3 and the division factor of the integer frequency divider 5 are determined so that the phase noise of the third clock signal 6 is equivalent to that of the first oscillator 1.

The spectral purities of the clock signals 2 and 6 are then of the same order of magnitude and these clock signals can then advantageously be mixed by a first mixer 11, so that the degradation, due to the respective noises of the mixed signals, is reduced, typically to about 3 dB. Thus, the first mixer 11 of such a synthesizer makes it possible to produce a fourth RF signal that can be used as RF carrier and the spectral purity of which is very high. The frequency of the carrier is continuously variable as a function of the frequency adjustment range of the third clock signal 6, which depends on the combination of the adjustment range of the oscillator 3 and the factor N1.

Figure 2:
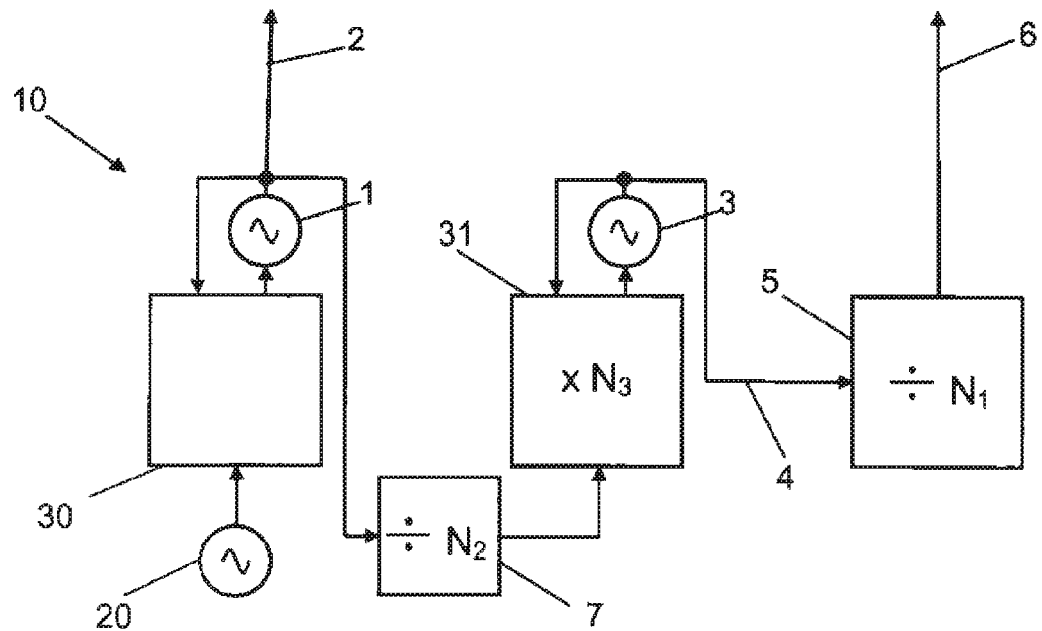
FIG. 2 shows a frequency synthesizer according to a second alternative of the present invention.

A second alternative, without mixer, is shown in reference to FIG. 2. It comprises a fractional frequency divider 7, with a variable fractional factor N2, producing the second reference frequency as output and the input of which is the first clock signal 2.

Furthermore, the second control means 31 multiples the second reference frequency by an integer factor N3 to produce the second clock signal 4.

The other elements, aside from the mixer 11, are the same as those shown in FIG. 1 and bear the same references.

This alternative has the same advantages as the first alternative. Furthermore, the first controlled oscillator 1 is used on the one hand to generate the first clock signal 2, but also to produce, via the fractional divider 7, the second reference frequency intended to control the frequency of the second controlled oscillator 3 using the second control device 31. The role of this control device 31 is to eliminate the phase noise introduced by the fractional divider 7, with wide frequency deviation of the carrier, and to make it possible to produce, using the fractional divider 5, a frequency ratio of (1/N2)* (N3/N1) between the first clock signal 2 and the third clock signal 6. By minimizing the values of N2 and N3, one obtains the best noise performance, which makes it possible to increase the bandwidth of the assembly formed by the controlled oscillator 3 and the control device 31. Furthermore, by dynamically changing the value of N2, a phase modulation can be done on the third clock signal 6, on the condition that the modulation frequency remains in the bandwidth of the second control device 31. According to this alternative, the first reference frequency can advantageously be obtained using a low-frequency quartz, for example 32 kHz, which is particularly interesting from the consumption perspective when the frequency synthesizer operates in intermittent mode and from the perspective of the number of external components needed, which is limited to that same quartz.

Figure 3:
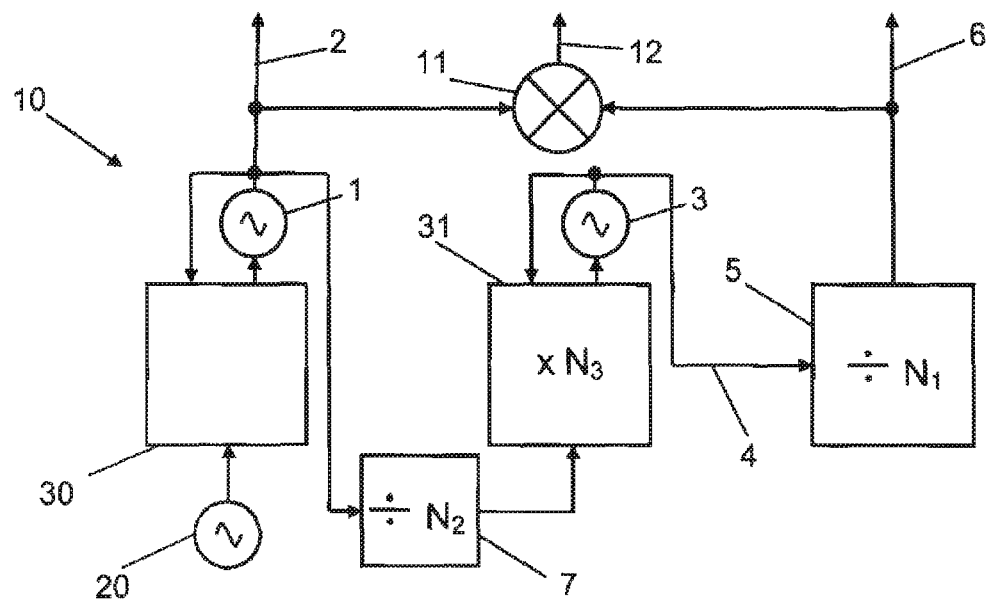
FIG. 3 shows a frequency synthesizer according to a third alternative of the present invention.

In a third alternative shown in reference to FIG. 3, the frequency synthesizer 10 comprises, in addition to the elements of the first alternative, the fractional divider 7 of the second alternative.

Figure 4:
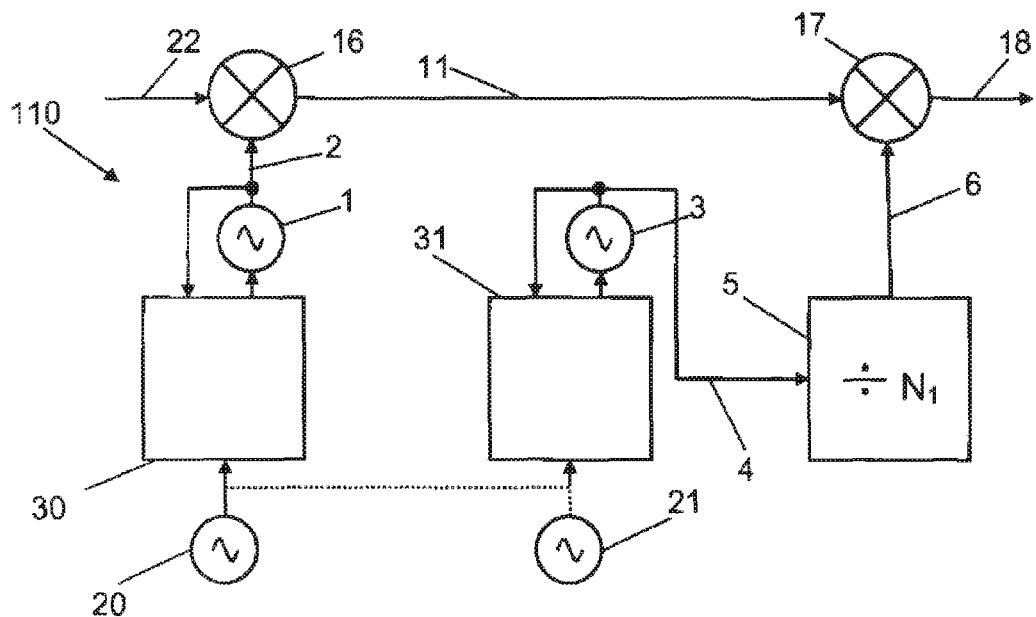
FIG. 4 shows a radiofrequency device using one of the frequency synthesizers according to the present invention.

A fourth alternative intended to be used as receiving channel synthesizer 110 is shown in reference to FIG. 4. With the exception of the first mixer 11, this fourth alternative uses the same elements as the first alternative, bearing the same references in the figure. It also comprises second 16 and third 17 mixers. The second mixer 16 is configured to mix a modulated RF input signal 22 with the first clock signal 2. The third mixer 17 is configured to mix the output signal of the second mixer 16 with the third clock signal 6 so that a low-frequency output signal is produced, corresponding to the baseband or low-IF transposition of the RF input signal 22.

Figure 5:
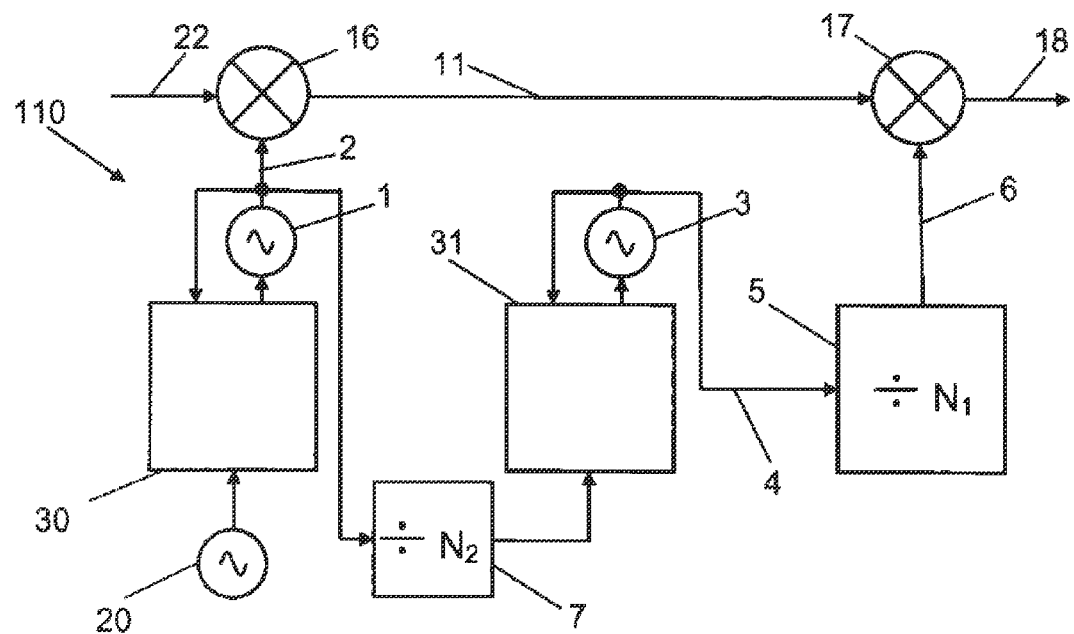
FIG. 5 shows a radiofrequency device using one of the frequency synthesizers according to the present invention.

A fifth alternative also intended to be used as receiving channel synthesizer 110 is shown in reference to FIG. 5. It uses the same elements as the fifth embodiment and also comprises the fractional divider 7 of the second alternative. It has a variable fractional factor N2. The input of the fractional divider 7 is the first clock signal 2 provided by the first controlled oscillator 1. The output of the fractional divider 7 is the second reference frequency.

The frequency synthesizers according to the various alternatives presented above can advantageously be used in radiofrequency devices.

Figure 6:
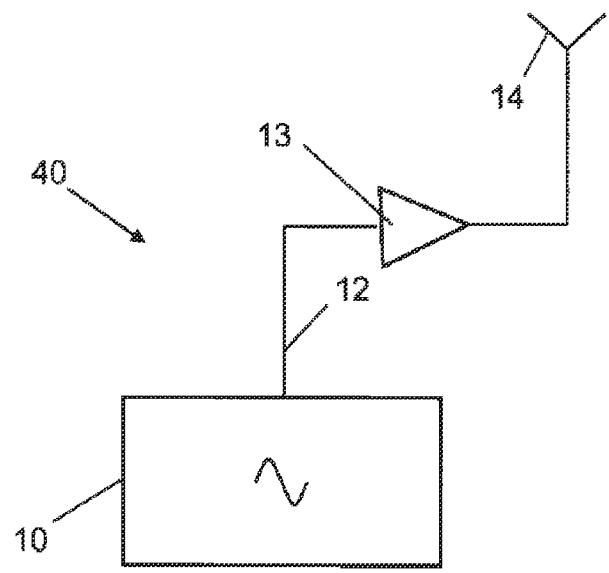
FIG. 6 shows a radiofrequency device forming a transmitter using one of the frequency synthesizers according to the present invention

Thus, relative to FIG. 6, the frequency synthesizer 10 according to the first or third alternative is used in a radiofrequency device forming an RF transmitter 40. The fourth variable-frequency RF signal 12 produced by the first mixer 11 (not visible in the figure) is used as RF carrier 12. For the third synthesizer alternative, the frequency modulation is obtained owing to the factor N2. By making that factor vary, it is possible to introduce the data to be transmitted and to very easily obtain a frequency-modulated RF carrier 12 with a high spectral purity. The device also comprises an RF amplifier 13, the input of which is connected to the RF carrier 12 and an antenna 14, transmitting the output signal of the RF amplifier 13.

Figure 7:
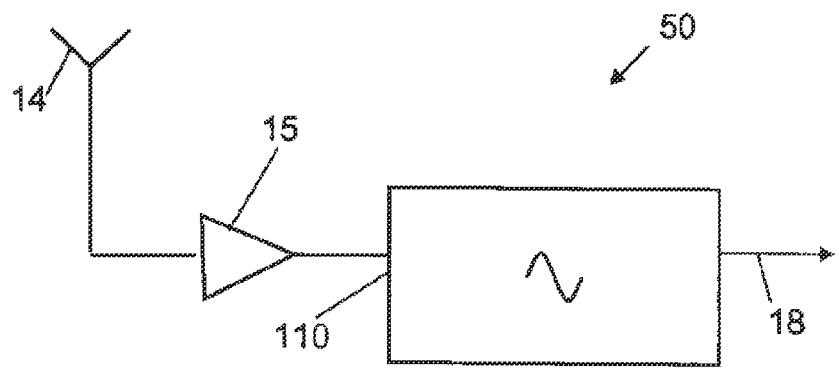
FIG. 7 shows a radiofrequency device forming a receiver using one of the frequency synthesizers according to the present invention.

Relative to FIG. 7, a radiofrequency device complementary to the preceding device is also obtained. The frequency synthesizer 10 according to the invention is used to form an RF receiver 50. To that end, the fourth or fifth alternative of the frequency synthesizer 110 is used. Moreover, an antenna 14 is configured to receive a reception signal and provide it as input of an RF receiver 15. The output of the RF receiver 15 is in turn provided as input of the receiving channel synthesizer 110. This produces, as output 18, a signal corresponding to the baseband or low-IF transposition of the signal received on the antenna 14.

Figure 8:
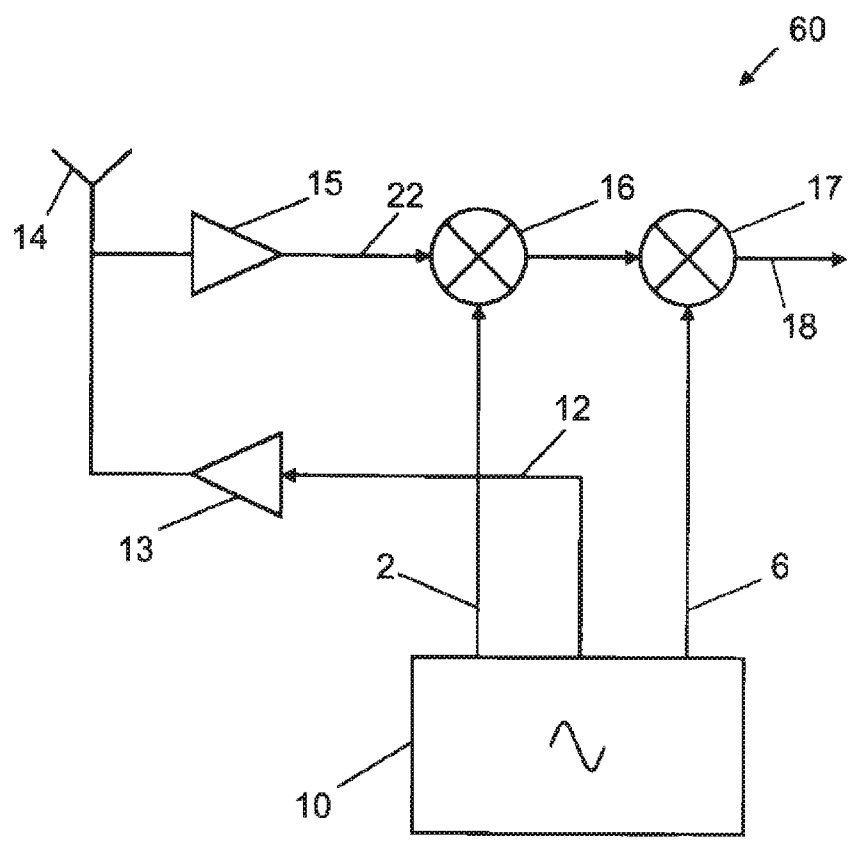
FIG. 8 shows a radiofrequency device forming a transmitter using one of the frequency synthesizers according to the present invention.

Lastly, relative to FIG. 8, a radiofrequency device combining the RF transmitter and receiver previously described is obtained in order to form a transmitter 60. To that end, the frequency synthesizer 10 according to the first or third alternative is used in the following description. It will, however, be noted that the frequency synthesizer 110 according to the fourth or fifth alternative makes it possible to obtain the same result. The frequency synthesizer 10 therefore generates a first clock signal 2, of the RF and fixed frequency type, a third clock signal 6, the frequency of which is variable, and an RF carrier 12, produced by the first mixer 11 (not visible in the figure). The transmitter 60 also comprises:
- an RF amplifier 13, the input of which is connected to the RF carrier 12,
- an antenna 14, transmitting the output signal of the RF amplifier 13, and receiving a reception signal,
- an RF receiver 15, the input of which is connected to the antenna 14,
- a second mixer 16, mixing the output signal of the receiver 15 and the first clock signal 2, and
- a third mixer 17, mixing the output signal of the second mixer 16 and the third clock signal 6, producing a signal corresponding to the baseband or low-IF transposition of the signal received on the antenna 14.

The frequency modulation caused by the variable factor N2 makes it possible to very easily obtain a frequency-modulated RF carrier 12 and having a high spectral purity so as to introduce the data to be transmitted.

A fixed frequency divider dividing the frequency by 2 can also be inserted between the third clock signal 6 on the one hand and the first 11 and third 17 mixers on the other hand, so as to generate quadrature signals. This configuration makes it possible to implement image-rejection mixers for the mixers 11, 16 and 17.

Of course, the present invention is open to various alternatives and modifications that will appear obvious to those skilled in the art.

The invention claimed is:

1. A frequency synthesizer comprising:
   a first oscillator controlled by a first control device, the first controlled oscillator having a high quality factor, typically greater than 300 and producing a first clock signal RF having a fixed frequency,
   the first control device controlling the frequency of the first controlled oscillator on the basis of a first reference frequency;
   a second oscillator controlled by a second control device, and producing a second clock signal,
   the second control device controlling the frequency of the second controlled oscillator on the basis of a second reference frequency;
   an integer frequency divider, dividing the frequency of the second clock signal by a variable integer factor N1 and producing a third clock signal, the frequency of which is continuously variable by modifying the factor N1 and the control of the second oscillator; and
   a first mixer arranged to mix the first and third clock signals, and to produce a fourth RF signal having a variable frequency.

2. The frequency synthesizer of claim 1, comprising a fractional frequency divider, the input of which is the first clock signal, said fractional frequency divider dividing the frequency of the first clock signal by a variable fractional factor N2, producing the second reference frequency, the second control device multiplying the frequency of the second reference frequency by a factor N3, to produce the second clock signal.

3. The frequency synthesizer of claim 2, wherein the first reference frequency is produced by a third fixed oscillator.

4. The frequency synthesizer of claim 1, wherein the first reference frequency is produced by a third fixed oscillator and the second reference frequency is produced by a fourth fixed oscillator.

5. The frequency synthesizer of claim 1, wherein the first and second reference frequencies are identical and produced by a third fixed oscillator.

6. The frequency synthesizer according to claim 1, wherein the first controlled oscillator comprises a resonator of the BAW or SAW type.

7. The frequency synthesizer according to claim 1, wherein the second controlled oscillator is an LC oscillator.

8. A radiofrequency device comprising:
   the frequency synthesizer according to claim 1;
   an RF amplifier, the input of which is connected to the fourth RF signal having a variable frequency as output of the frequency synthesizer; and
   an antenna, configured to transmit the output signal of the RF amplifier.

9. The radiofrequency device according to claim 8, wherein the mixers are image-rejection mixers.

10. A radiofrequency device comprising:
    the frequency synthesizer according to claim 1, the fourth RF signal of which is used as RF carrier;
    an RF amplifier, the input of which is connected to the fourth RF signal;
    an antenna configured to transmit the output signal of the RF amplifier and to receive a reception signal;
    an RF receiver, the input of which is connected to the antenna;
    a second mixer, configured to mix the output signal of the receiver and the first clock signal; and
    a third mixer configured to mix the output signal of the second mixer and the third clock signal, to produce a signal corresponding to the baseband or low-IF transposition of the received signal on the antenna.

11. The radiofrequency device according to claim 10, comprising a fixed frequency divider, intended to divide the frequency by 2, inserted between the third clock signal on the one hand and the first and third mixers on the other hand.

12. A frequency synthesizer comprising:
    a first oscillator controlled by a first control device, the first controlled oscillator having a high quality factor, typically greater than 300 and producing a first clock signal RF having a fixed frequency,
    the first control device controlling the frequency of the first controlled oscillator on the basis of a first reference frequency;
    a second oscillator controlled by a second control device, and producing a second clock signal,
    the second control device controlling the frequency of the second controlled oscillator on the basis of a second reference frequency;
    an integer frequency divider, dividing the frequency of the second clock signal by a variable integer factor N1 and producing a third clock signal, the frequency of which is continuously variable by modifying the factor N1 and the control of the second oscillator; and
    a fractional frequency divider, the input of which is the first clock signal and dividing its frequency by a variable fractional factor N2, producing the second reference frequency, the second control device multiplying the frequency of the second reference frequency by a factor N3, to produce the second clock signal.

13. A receiving channel frequency synthesizer comprising the frequency synthesizer according to claim 12, and also comprising:
    a second mixer configured to mix a modulated RF input signal and the first clock signal; and
    a third mixer, configured to mix the output signal of the second mixer and the third clock signal, to produce a low-frequency output signal.

14. The receiving channel frequency synthesizer of claim 13, wherein the first reference frequency is produced by a third fixed oscillator.

15. A radiofrequency device comprising:
an antenna configured to receive a reception signal;
an RF receiver, the input of which is connected to the antenna; and
the receiving channel frequency synthesizer according to claim 13, configured to receive, as input, the output of the RF receiver and to produce, as output, a signal corresponding to the baseband or low-IF transposition of the received signal on the antenna.

16. The frequency synthesizer of claim 12, wherein the first reference frequency is produced by a third fixed oscillator.

17. A receiving channel frequency synthesizer comprising:
a first oscillator controlled by a first control device, the first oscillator having a high quality factor, typically greater than 300 and producing a first clock signal RF having a fixed frequency,
the first control device, controlling the frequency of the first controlled oscillator on the basis of a first reference frequency;
a second oscillator controlled by a second control device, and producing a second clock signal,
the second control device controlling the frequency of the second controlled oscillator on the basis of a second reference frequency;
an integer frequency divider, dividing the frequency of the second clock signal by a variable integer factor N1 and producing a third clock signal, the frequency of which is continuously variable by modifying the factor N1 and the control of the second oscillator;
a second mixer, configured to mix a modulated RF input signal and the first clock signal; and
a third mixer, configured to mix the output signal of the second mixer and the third clock signal, to produce a low-frequency output signal.

18. The receiving channel frequency synthesizer of claim 17, wherein the first reference frequency is produced by a third fixed oscillator and the second reference frequency is produced by a fourth fixed oscillator.

19. The receiving channel frequency synthesizer of claim 17, wherein the first and second reference frequencies are identical and produced by a third fixed oscillator.

20. A radiofrequency device comprising:
an antenna configured to receive a reception signal;
an RF receiver, the input of which is connected to the antenna; and
the receiving channel frequency synthesizer according to claim 17, configured to receive, as input, the output of the RF receiver and to produce, as output, a signal corresponding to the baseband or low-IF transposition of the received signal no the antenna.

* * * * *